(12) United States Patent
Boland

(10) Patent No.: US 8,402,594 B2
(45) Date of Patent: Mar. 26, 2013

(54) WINDSCREEN WIPER DEVICE

(75) Inventor: Xavier Boland, Arlon (BE)

(73) Assignee: Federal-Mogul S.A., Aubange (BE)

( * ) Notice: Subject to any disclaimer, the term of this patent is extended or adjusted under 35 U.S.C. 154(b) by 231 days.

(21) Appl. No.: 12/918,261

(22) PCT Filed: Feb. 17, 2009

(86) PCT No.: PCT/EP2009/051872
§ 371 (c)(1),
(2), (4) Date: Aug. 18, 2010

(87) PCT Pub. No.: WO2009/103708
PCT Pub. Date: Aug. 27, 2009

(65) Prior Publication Data
US 2010/0319155 A1    Dec. 23, 2010

(30) Foreign Application Priority Data

Feb. 18, 2008    (EP) .................................... 08101705

(51) Int. Cl.
*B60S 1/02* (2006.01)
*B60S 1/32* (2006.01)
*B60S 1/38* (2006.01)

(52) U.S. Cl. ........... 15/250.201; 15/250.361; 15/250.43; 15/250.48

(58) Field of Classification Search ............... 15/250.04, 15/250.201, 250.43, 250.361, 250.451, 250.48; *B60S 1/38*
See application file for complete search history.

(56) References Cited

U.S. PATENT DOCUMENTS

| | | | | |
|---|---|---|---|---|
| 2,760,220 A * | 8/1956 | Deibel | ..................... | 15/250.452 |
| 4,152,808 A * | 5/1979 | Andregg | ..................... | 15/250.07 |
| 6,401,292 B1 * | 6/2002 | Leutsch | ..................... | 15/250.48 |
| 2002/0023309 A1 * | 2/2002 | Leutsch | ..................... | 15/250.48 |
| 2003/0159229 A1 * | 8/2003 | Weiler et al. | ............. | 15/250.201 |
| 2005/0011033 A1 * | 1/2005 | Thomar et al. | ........... | 15/250.201 |
| 2007/0017056 A1 * | 1/2007 | Cooke et al. | ............. | 15/250.201 |
| 2008/0052865 A1 * | 3/2008 | Chiang | ..................... | 15/250.43 |
| 2010/0170055 A1 * | 7/2010 | Boland | ..................... | 15/250.32 |

FOREIGN PATENT DOCUMENTS

| | | | |
|---|---|---|---|
| EP | 523975 A1 * | 1/1993 | |
| EP | 1627787 A | 2/2006 | |
| EP | 1767416 A | 3/2007 | |
| WO | WO 02/090155 A | 11/2002 | |

* cited by examiner

*Primary Examiner* — Joseph J Hail
*Assistant Examiner* — Marc Carlson
(74) *Attorney, Agent, or Firm* — Robert L. Stearns; Dickinson Wright PLLC

(57) ABSTRACT

A windscreen wiper device comprising an elastic, elongated carrier element, as well as an elongated wiper blade, which can be placed in abutment with a windscreen to be wiped, which wiper blade includes at least one longitudinal groove, in which groove a longitudinal strip of the carrier element is disposed, wherein ends of the longitudinal strip are connected to a respective connecting piece, which windscreen wiper device comprises a connecting device for an oscillating arm, wherein the wiper blade comprises an elongated upper holding part and an elongated lower wiping part of a flexible material, wherein the holding part comprises downwardly extending side arms for holding the wiping part from the outside in a lateral region thereof, wherein the holding part is provided with an elongated reinforcement element, and wherein the holding part and the reinforcement element are mutually connected through co-extrusion.

14 Claims, 4 Drawing Sheets

WINDSCREEN WIPER DEVICE

BACKGROUND OF THE INVENTION

1. Technical Field

Figure 1:
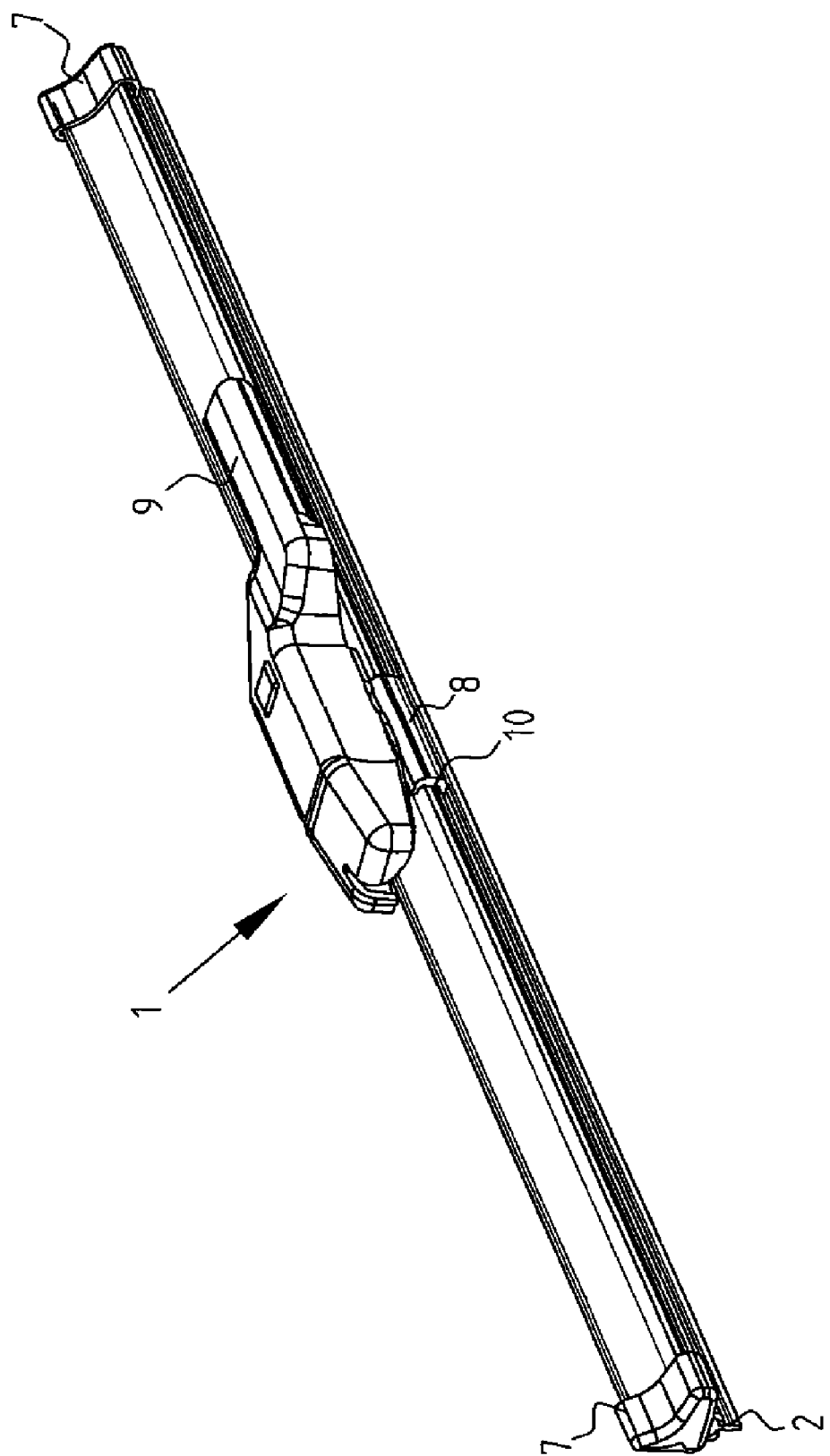

The present invention relates to a windscreen wiper device comprising an elastic, elongated carrier element, as well as an elongated wiper blade, which can be placed in abutment with a windscreen to be wiped, which wiper blade includes at least one longitudinal groove, in which groove a longitudinal strip of the carrier element is disposed, wherein ends of the longitudinal strip are connected to a respective connecting piece, which windscreen wiper device comprises a connecting device for an oscillating arm.

2. Related Art

Such a windscreen wiper device is known from international (PCT-) patent publication no. WO 02/090155 in the name of the same Applicant. The prior art windscreen wiper device is in particular designed as a "yokeless" wiper device or "flat blade", wherein use is no longer made of several yokes pivotally connected to each other, but wherein the wiper blade is biassed by the carrier element, as a result of which it exhibits a specific curvature. In this known windscreen wiper device the wiper blade includes two opposing longitudinal grooves on its longitudinal sides, in which grooves spaced-apart longitudinal strips of the carrier element are disposed. Neighbouring ends of the longitudinal strips are interconnected by the respective connecting piece.

A sometimes felt disadvantage of the windscreen wiper device as described in the above international (PCT-) patent publication is that a rubber wiping lip of the wiper blade might show a permanent deformation after several months of use, as the wiping lip has to make many oscillating movements during use, wherein the wiping lip has to bend severely. Bending the rubber of the wiping lip many times back and forth might lead to a permanent deformation of the rubber and thus to deteriorated wiping properties, with all negative consequences involved.

SUMMARY OF THE INVENTION

It is an object of the invention to improve the prior art, that is to improve a windscreen wiper device known from the above international (PCT-) patent publication, wherein a permanent deformation of the wiping lip is avoided at all times.

In order to accomplish that objective, a windscreen wiper device of the kind referred to in the introduction according to the invention is characterized in that the wiper blade comprises an elongated upper holding part and an elongated lower wiping part of a flexible material, wherein the holding part holds the wiping part, wherein the holding part comprises downwardly extending side arms, seen in cross-section, for holding the wiping part, from the outside in a lateral region thereof, wherein the holding part is provided with an elongated reinforcement element, and wherein the holding part and the reinforcement element are mutually connected through co-extrusion. Preferably, the side arms of the holding part pivotally engage the wiping part from the outside in a lateral region thereof, so that a mechanical articulation is realized between the holding part and the wiping part, wherein the holding part holds the wiping part allowing the wiping part to make pivotal or hingeable movements relative to the holding part during use. In use the pivotal movements of the wiping part correspond to oscillatory movements of the oscillating arm.

Due to the mechanical articulation the wiping part will not have to bend to follow the oscillatory movements of the oscillating arm, so that a permanent deformation of the wiping part as a result of stress in the rubber thereof is avoided. The reinforcement element ensures that the holding part has a flexural or bending stiffness in transverse direction, so that the holding part is allowed to firmly hold the wiping part.

In a preferred embodiment of a windscreen wiper device in accordance with the invention, the reinforcement element extending in longitudinal direction has a bending stiffness in transverse direction and is flexible in longitudinal direction. Particularly, the reinforcement element is provided with spaced-apart profiles extending in transverse and longitudinal directions. Hence, the reinforcement element enhances the stiffness of the holding part in transverse direction, allowing the holding part to firmly retain the wiping part thereon. Simultaneously, the reinforcement element is flexible enough to follow any bending of the longitudinal strip along the curvature of the windscreen to be wiped. Accordingly, the reinforcement element incorporates two features which at first sight appear to be incompatible, namely having a bending stiffness in transverse direction and having flexibility in longitudinal direction. This is particularly achieved by the profiles put at a distance form each other.

In another preferred embodiment of a windscreen wiper device according to the invention, the spaced-apart profiles have a C-shaped cross-section. In the alternative, first and second spaced-apart profiles each having a C-shaped cross-section are provided, wherein the C s of the first and second profiles are different in size.

In another preferred embodiment of a windscreen wiper device in accordance with the invention, the at least one longitudinal groove having a open circumference is provided on the holding part at an upper side thereof facing away from the wiping part. Particularly, the longitudinal strip can be easily mounted inside the central groove by hand, for example. More in particular, longitudinal sides of the holding part are bend inwardly at the location of its upper side, thereby defining the longitudinal groove. Accordingly, the longitudinal strip is firmly retained inside the groove. In the alternative, the holding part has a central groove having a closed circumference.

In another preferred embodiment of a windscreen wiper device according to the invention, the side arms of the holding part pivotally engage the wiping part from the outside in a lateral region thereof. Particularly, the holding part further comprises additional downwardly extending engaging means for pivotally engaging the wiping part in an upper region thereof. The additional engaging means ensure that a wiping lip of the wiping part is tumbled over at each turning point of its oscillary movement with the biggest reversal torque.

In another preferred embodiment of a windscreen wiper device in accordance with the invention, the wiping part comprises a wiping lip, a neck extending from the wiping lip, as well as an enlarged head extending from the neck, and wherein the enlarged head is mounted into a hollow chamber defined by the side arms of the holding part. The enlarged head preferably has a circular, elliptical, square, rectangular, rhomboid or heart-shaped cross-section. The wiping lip is placed in abutment with a windscreen to be wiped. The wiping lip, the neck and the enlarged head particularly are in one piece and extend in longitudinal direction along the entire length of the wiper blade.

Particularly, the additional engaging means engage the enlarged head at the location of its upper surface. More in particular, the engaging means comprise a downwardly extending (elongated) protrusion engaging the enlarged head in a correspondingly shaped slit thereof. Preferably, the protrusion extends along the entire length of the wiper blade and is made in one piece with the holding part.

In another preferred embodiment of a windscreen wiper device according to the invention the arms of the holding part comprise inwardly extending end parts, wherein the neck is located at least partly between the end parts, and wherein the enlarged head is located above the end parts. In other words, the enlarged head is confined in the hollow chamber, wherein the hook-shaped end parts further retain the wiping part onto the holding part. Particularly, the hollow chamber comprises a lubricant in order to allow smooth pivotal movements of the wiping part without wear.

In another preferred embodiment of a windscreen wiper device according to the invention, the holding part is provided with a spoiler at a side thereof facing away from the wiping part. The spoiler may be provided with engaging members engaging around longitudinal sides of the holding part. Preferably, the spoiler is entirely detachably connected to the holding part. In the alternative, the spoiler is in one piece with the holding part.

The holding part and the wiping part preferably extend in longitudinal direction along the entire length of the wiper blade. In other words, the wiper blade consists of two mutually cooperating constructional elements, namely the holding part and the wiping part. The parts are preferably slidably connected to each other, wherein the enlarged head of the wiping part is slidably mounted into the hollow chamber of the holding part. The hollow chamber extends along the entire length of the wiper blade so as to form a channel with two open ends. One of the open ends of the channel forms an entrance through which the wiping part as a separate construction element can be slid by hand into the channel until the wiping part is finally retained onto the holding part (the first position). The open end also acts as an exit through which the wiping part can be slid by hand from the first position until the wiping part as a separate "loose" construction element can be replaced or repaired (the second position).

The wiping part is at least substantially made of an elastomeric material, such as rubber, wherein the holding part is at least substantially made of a plastic material. The reinforcement element is particularly made of metal.

THE DRAWINGS

Figure 2:
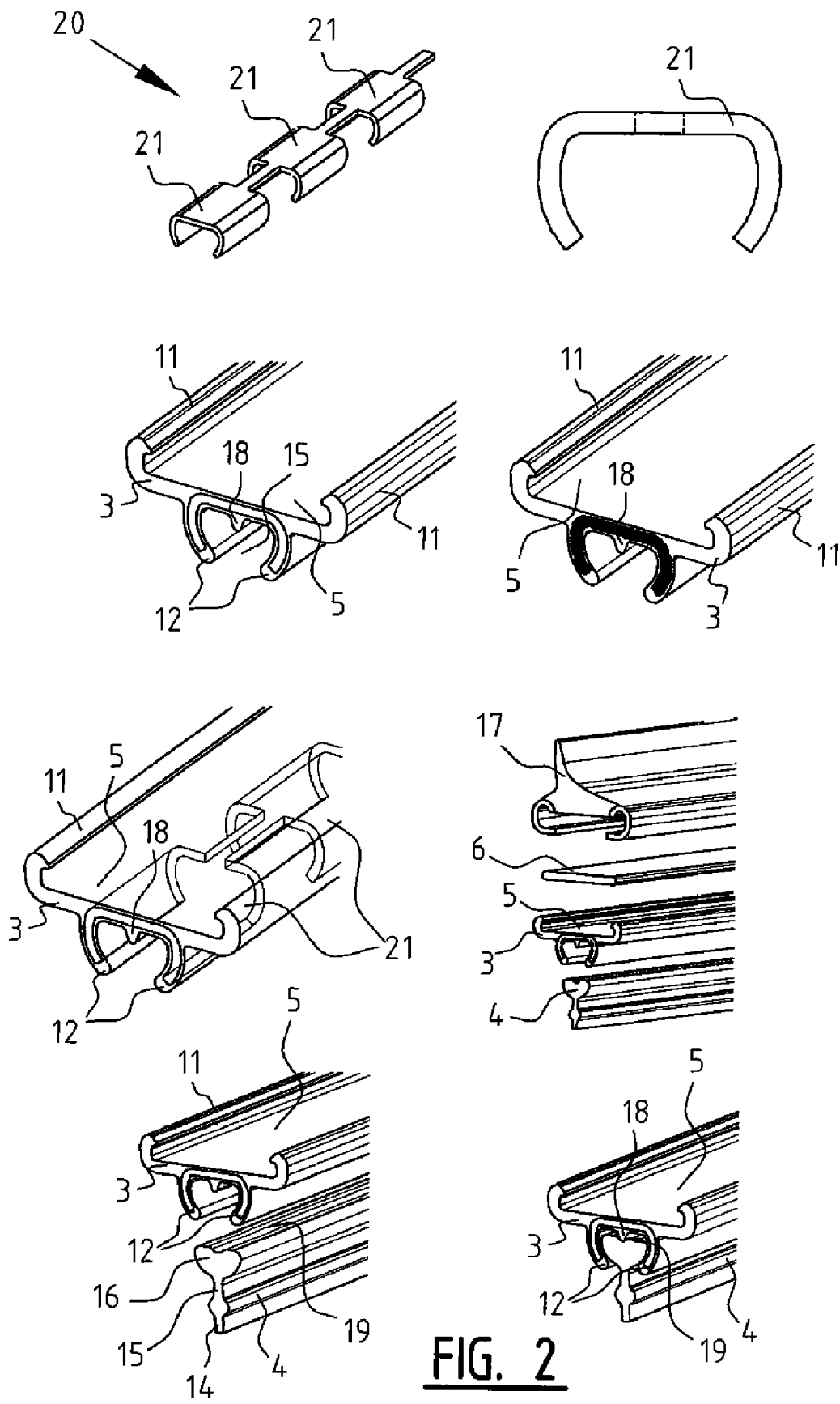
Figure 3:
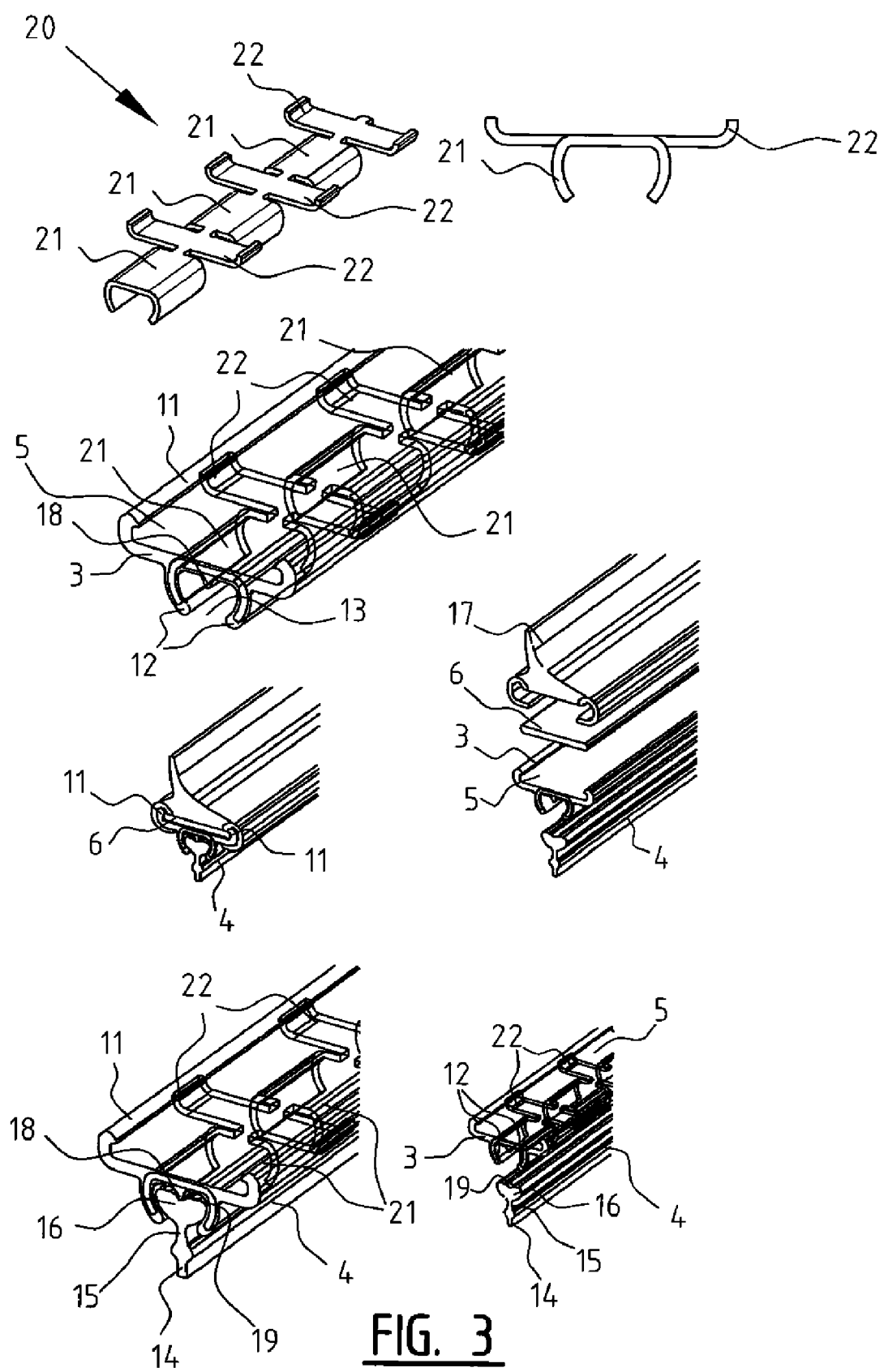
Figure 4:
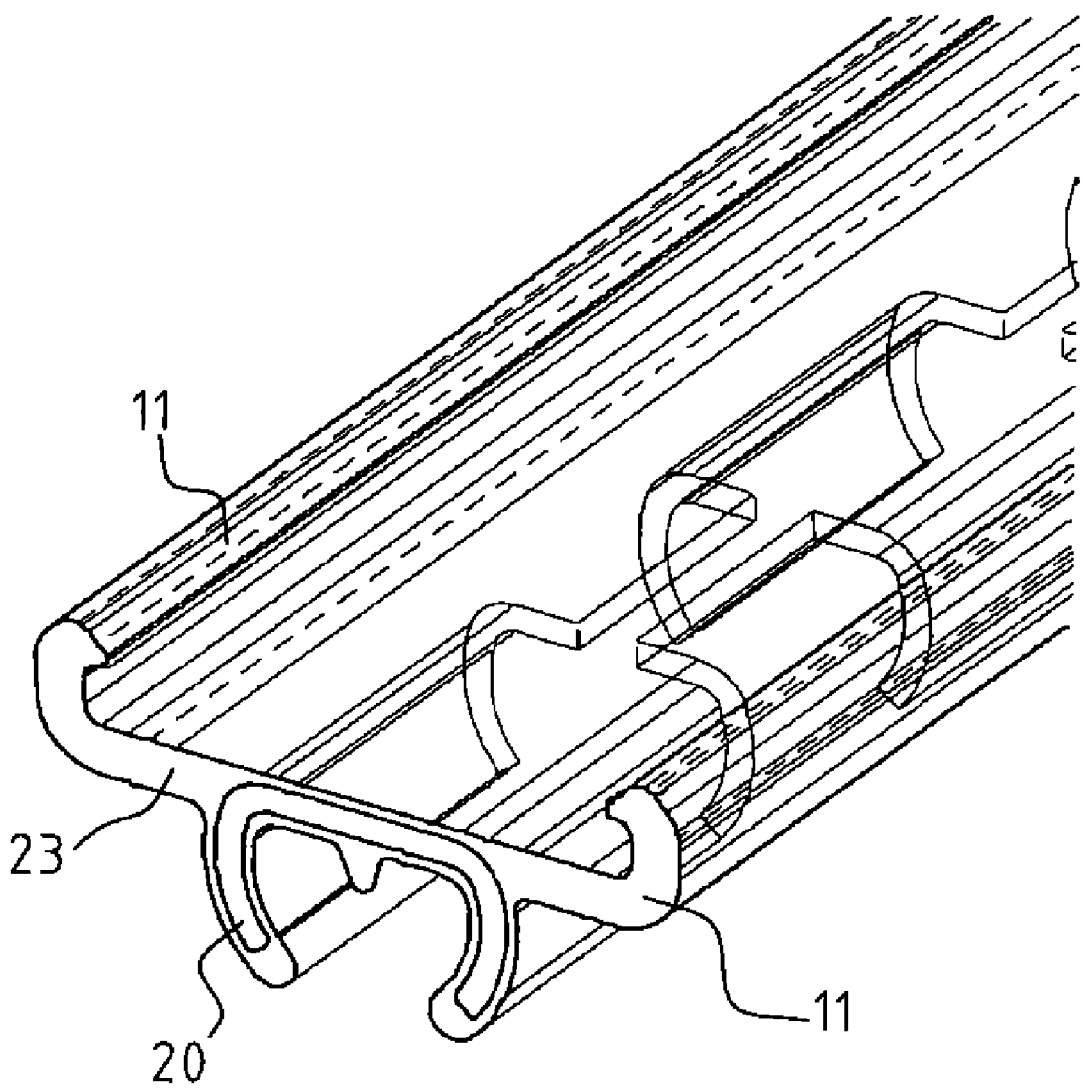

The invention will now be explained in more detail with reference to figures illustrated in a drawing, wherein:

FIG. 1 shows a perspective view of a windscreen wiper device according to a preferred embodiment of the invention; and FIGS. 2, 3 and 4 are perspective views of parts of the windscreen wiper of FIG. 1, partly in exploded view.

DETAILED DESCRIPTION

FIG. 1 shows a preferred variant of a windscreen wiper device 1 according to the invention, the windscreen wiper device 1 is built up of a wiper blade 2 having a plastic elongated upper holding part 3 and an elastomeric elongated lower wiping part 4, both extending in longitudinal direction along the entire length of the wiper blade 2. In the holding part 3 a central longitudinal groove 5 is formed, in which a longitudinal strip 6 made of spring band steel is fitted (FIGS. 2 and 3). The strip 6 forms a flexible carrier element for the rubber wiper blade 2, as it were, which is thus biased in a curved position (the curvature in operative position being that of a windscreen to be wiped). Outer ends of the strip 6 are connected on either side of the windscreen wiper device 1 to connecting pieces 7 functioning as clamping members. In this embodiment, the connecting pieces 7 are separate constructional elements, which may be form-locked as well as force-locked to the outer ends of the strip 6. In another preferred variant, the connecting pieces 7 are in one piece with the strip 6 made of spring band steel.

The windscreen wiper device 1 is furthermore built up of a connecting device 8 of plastic or metallic material for an oscillating wiper arm 9. The connecting device 8 comprises clamping members 10 that are integral therewith, which engage round longitudinal sides 11 of the holding part 3 that face away from each other, as a result of which the connecting device 8 is firmly attached to the unit made up of the holding part 3 and the strip 6. Likewise, the connecting pieces 7 comprise similar clamping members. The oscillating wiper arm 9 is pivotally connected to the connecting device 8 about a pivot axis near one end thereof.

As can be seen from FIGS. 2 and 3, the holding part 3 is provided with downwardly extending side arms 12 in one piece therewith, seen in cross-section, thus defining a hollow chamber or space 13, again seen in cross-section. The hollow chamber 13 extends in longitudinal direction along the entire length of the wiper blade 2, so as to form a channel with two open outer ends. Again referring to FIGS. 2 and 3, the wiping part 4 comprises a wiping lip 14, a neck 15 extending from the wiping lip 14, as well as an enlarged head 16 extending from the neck 15 and having a heart-shaped cross-section. The parts 3,4 are slidably connected to each other, wherein the enlarged head 16 of the wiping part 4 is slidably mounted into the hollow channel of the holding part 3. One of the open ends of the channel forms an entrance through which the wiping part 4 as a separate construction element can be slid by hand into the channel until the wiping part 4 is finally retained onto the holding part 3 (the first or holding position). The open end also acts as an exit through which the wiping part 4 can be slid by hand from the first position until the wiping part 4 as a separate "loose" construction element can be replaced or repaired (the second position). The side arms 12 of the holding part 3 pivotally engage the enlarged head 16 of the wiping part 4, so as to allow a pivotal or hingeable movement of the wiping part 4 when the oscillating wiper arm 9 attached to the holding part 3 makes a corresponding oscillatory movement.

As shown, the holding part 3 is connected to a detachable spoiler 17 at a side thereof facing away from the wiping part 4, wherein the spoiler 17 is equipped with engaging members engaging around longitudinal sides 11 of the holding part 3. The longitudinal sides 11 are bend inwardly to firmly retain the longitudinal strip 6 inside the groove 5.

With reference to FIGS. 2 and 3, a bottom of the holding part 3 is provided with additional engaging means in the form of a downwardly extending protrusion 18 which extends in longitudinal direction along a part of the length of the wiper blade 2 or along the entire length thereof. The protrusion 18 engages into a correspondingly shaped slit 19 provided on an upper surface of the hollow chamber 13 by means of free ends of the side arms 12 and the protrusion 18. Hence, an unstable design is obtained, wherein the torque is maximal when the wiping lip 14 tumbles over at each turning point of its oscillatory movement.

The holding part 3 is provided with an elongated reinforcement 20 element in one piece of metal, wherein the holding part 3 and the reinforcement element 20 are mutually connected through co-extrusion. The reinforcement element 20 extending in longitudinal direction along the entire length of the holding part 3 has a bending stiffness in transverse direction and is flexible in longitudinal direction. This is realized by providing the reinforcement element 20 with profiles 21 spaced-apart longitudinally from one another therealong by intervening portions, wherein the intervening portions, also referred to as bridges, differ in shape from the profiles 21, wherein the profiles are shown, for example, having a C-shaped or U-shaped cross-section (FIG. 2) and extending in transverse and longitudinal directions. In other words, by removing (cutting, sawing, stamping, for example) material at regular distances from the C-shape, a reinforcement element 20 is obtained with profiles 21 having a C-shaped or U-shaped cross-section and being positioned at a constant distances from each other. With reference to FIG. 3, first and second spaced-apart profiles 21,22 are each spaced-apart longitudinally from one another therealong by intervening portions, wherein the intervening portions, also referred to as bridges, differ in shape from the profiles 21,22 wherein the profiles are shown, for example, as each having a C-shaped cross-section, wherein the C of the first profiles 21 is smaller than the C of the second profiles 22. In both embodiments the reinforcement element 20 enhances the stiffness of the holding part 3 in transverse direction, allowing the holding part 3 to firmly retain the wiping part 4 thereon. Simultaneously, the reinforcement element 20 is flexible enough to follow any bending of the longitudinal strip 6 along the curvature of the windscreen to be wiped. Accordingly, the reinforcement element 20 incorporates two features which at first sight appear to be incompatible, namely having a bending stiffness in transverse direction and having flexibility in longitudinal direction. This is particularly achieved by the profiles 21,22 put at a distance from each other.

FIG. 4 corresponds to FIGS. 2 and 3, albeit that another embodiment of the reinforcement element 20 is shown. Further, longitudinal sides 11 of the holding part 3 are co-extruded relative to the central part 23 of the holding part 3, wherein the longitudinal sides 11 are made of a stiffer material compared to the material of the central part 23.

Although not depicted in the figures, it will be clear for a person skilled in the art that the oscillating wiper arm 9 is connected to a mounting head fixed for rotation to a shaft driven by a small motor. In use, the shaft rotates alternately in a clockwise and in a counter-clockwise sense carrying the mounting head into rotation also, which in turn draws the oscillating wiper arm 9 into rotation and by means of the connecting device 8 moves the wiper blade 2.

The invention is not restricted to the embodiments shown, but also extends to other preferred variants falling within the scope of the appended claims. For example, a skilled person would easily understand that the central longitudinal strip 6 of FIGS. 2 and 3 could well be replaced by two longitudinal strips 6 located in correspondingly shaped grooves 5 in the holding part 3.

The invention claimed is:

1. A yokeless windscreen wiper device comprising an elastic, elongated carrier element, as well as an elongated wiper blade, which can be placed in abutment with a windscreen to be wiped, which wiper blade includes at least one longitudinal groove having an open circumference, in which groove a longitudinal strip of the carrier element is disposed, wherein ends of said longitudinal strip are connected to a respective connecting piece, which windscreen wiper device comprises a connecting device for an oscillating arm, said wiper blade comprises an elongated upper holding part and an elongated lower wiping part of a flexible material, wherein said holding part comprises downwardly extending side arms for holding said wiping part from the outside in a lateral region thereof, wherein said at least one longitudinal groove having an open circumference is provided on said holding part at an upper side thereof facing away from said wiping part, wherein said holding part is provided with an elongated reinforcement element having profiles spaced-apart longitudinally from one another therealong by intervening portions, said intervening portions differing in shape from said profiles to provide said reinforcement element with an enhanced bending flexibility in the longitudinal direction and an enhanced bending stiffness in the transverse direction, and wherein said holding part and said reinforcement element are mutually connected through co-extrusion.

2. A yokeless windscreen wiper device according to claim 1, wherein said spaced-apart profiles have a C-shaped cross-section.

3. A yokeless windscreen wiper device according to claim 1, wherein said spaced-apart profiles include first and second spaced-apart profiles having a C-shaped cross-section, and wherein said C-shaped cross-sections of said first and second spaced-apart profiles are different in size.

4. A yokeless windscreen wiper device according to claim 1, wherein said side arms of said holding part pivotally engage said wiping part from the outside in a lateral region thereof to allow said wiping part to pivot within said side arms of said holding part.

5. A yokeless windscreen wiper device according to claim 4, wherein said holding part further comprises additional downwardly extending engaging means for pivotally engaging said wiping part in an upper region thereof.

6. A yokeless windscreen wiper device according to claim 5, wherein said additional downwardly extending engaging means engage an enlarged head of said wiping part.

7. A yokeless windscreen wiper device according to claim 6, wherein said additional downwardly extending engaging means comprise a downwardly extending protrusion engaging said enlarged head in a slit thereof.

8. A yokeless windscreen wiper device according to claim 1, wherein said wiping part comprises a wiping lip, a neck extending from said wiping lip, as well as an enlarged head extending from said neck, and wherein said enlarged head is mounted into a hollow chamber defined by said side arms of said holding part, said side arms engaging said enlarged head with said enlarged head being free to pivot within said hollow chamber.

9. A yokeless windscreen wiper device according to claim 8, wherein said enlarged head has one of a circular, elliptical, square, rectangular, rhomboid or heart-shaped cross-section.

10. A yokeless windscreen wiper device according to claim 8, wherein said side arms of said holding part comprise inwardly extending end parts, and wherein said neck is located at least partly between said end parts and the enlarged head is located above said end parts.

11. A yokeless windscreen wiper device according to claim 8, wherein said hollow chamber includes a lubricant.

12. A yokeless windscreen wiper device according to claim 1, wherein said holding part is provided with a spoiler at a side thereof facing away from said wiping part.

13. A yokeless windscreen wiper device according to claim 12, wherein said spoiler is detachably connected to said holding part.

14. A yokeless windscreen wiper device according to claim 12, wherein said spoiler is provided in one piece therewith engaging members engaging around longitudinal sides of said holding part.

* * * * *